United States Patent
Kai et al.

(10) Patent No.: US 7,414,880 B2
(45) Date of Patent: Aug. 19, 2008

(54) MAGNETORESISTIVE EFFECT ELEMENT AND MAGNETIC MEMORY

(75) Inventors: Tadashi Kai, Tokyo (JP); Masahiko Nakayama, Fuchu (JP); Sumio Ikegawa, Musashino (JP); Yoshiaki Fukuzumi, Yokohama (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 11/378,358

(22) Filed: Mar. 20, 2006

(65) Prior Publication Data

US 2007/0013015 A1    Jan. 18, 2007

(30) Foreign Application Priority Data

Jul. 15, 2005    (JP) ............................. 2005-207499

(51) Int. Cl.
*G11C 11/00* (2006.01)
(52) U.S. Cl. .................. 365/158; 365/173; 257/295
(58) Field of Classification Search ............. 365/158, 365/173; 257/295
See application file for complete search history.

(56) References Cited

U.S. PATENT DOCUMENTS

| | | |
|---|---|---|
| 5,748,524 A | 5/1998 | Chen et al. |
| 5,757,695 A | 5/1998 | Shi et al. |
| 6,949,779 B2 | 9/2005 | Kai et al. |
| 2005/0199926 A1 | 9/2005 | Fukuzumi et al. |
| 2005/0242384 A1 | 11/2005 | Iwata et al. |
| 2006/0083053 A1* | 4/2006 | Hosotani ................ 365/158 |

FOREIGN PATENT DOCUMENTS

JP    2000-100153    4/2000

OTHER PUBLICATIONS

Youfeng Zheng, et al., "Switching Field Variation in Patterned Submicron Magnetic Film Elements", J. Appl. Phys., vol. 81, No. 8, Apr. 15, 1997, pp. 5471-5473.

* cited by examiner

*Primary Examiner*—Hoai V Ho
(74) *Attorney, Agent, or Firm*—Oblon, Spivak, McClelland, Maier & Neustadt, P.C.

(57) ABSTRACT

A magnetoresistive effect element includes a nonmagnetic layer having mutually facing first and second surfaces. A reference layer is provided on the first surface and has a fixed magnetization direction. A magnetization variable layer is provided on the second surface, has variable magnetization direction, and has a planer shape including a rectangular part, a first projected part, and a second projected part. The rectangular part has mutually facing first and second longer sides and mutually facing first and second shorter sides. The first projected part projects from the first longer side at a position shifted from the center toward the first shorter side. The second projected part projects from the second longer side at a position shifted from the center toward the second shorter side.

12 Claims, 5 Drawing Sheets

MAGNETORESISTIVE EFFECT ELEMENT AND MAGNETIC MEMORY

CROSS-REFERENCE TO RELATED APPLICATIONS

This application is based upon and claims the benefit of priority from prior Japanese Patent Application No. 2005-207499, filed Jul. 15, 2005, the entire contents of which are incorporated herein by reference.

BACKGROUND OF THE INVENTION

1. Field of the Invention

The present invention relates to a magnetoresistive effect element, and to a magnetic memory. For example, the present invention relates to the shape of a ferromagnetic tunnel junction element.

2. Description of the Related Art

There has been a magnetic memory using a ferromagnetic tunnel junction (MTJ) element as a memory cell. The MTJ element is mainly composed of ferromagnetic layer/insulating layer/ferromagnetic layer, which are successively stacked. A junction resistance to current tunneling the insulating layer to flow is minimum when the magnetization directions of two ferromagnetic layers are parallel to each other and is maximum when the magnetization directions of two ferromagnetic layers are anti-parallel to each other. This is called tunnel magnetoresistive effect.

One ferromagnetic layer is called a reference layer whose magnetization direction is fixed. The other ferromagnetic layer is called a recording layer whose magnetization direction changes. Parallel or anti-parallel state of the magnetization direction of the reference and storage layers is made to correspond to binary information, and thereby, information is stored. Write current flowing a write line that is provided around a memory cell generates a magnetic field to switch the magnetization of the recording layer to write information.

An advance in the scale-down of memory cell in order to improve the integration of magnetic memories reduces a ferromagnetic material forming the memory cell. Smaller ferromagnetic material generally has larger coercivity. Larger coercivity requires greater switching magnetic filed for switching the magnetization direction of a recording layer. Thus, a write current required for generating a switching magnetic filed becomes large; as a result, power consumption is increased. Therefore, in order to realize lower power consumption, it is important to reduce the coercivity of the small magnetic material.

Meanwhile, a parameter called a thermal fluctuation constant exists as an index of memory cell stably holding information for long term. The thermal fluctuation appears to be proportional to volume and coercivity in general. Therefore, high thermal stability is required to hold information for long term; nevertheless, reduced power consumption degrades the thermal stability.

Moreover, an edge domain gives an influence to a switching magnetic field. The edge domain is a special magnetic domain and appears around an edge of a rectangular micro ferromagnetic material whose width of the shorter axis is, for example, less than sub-micron from several microns. The edge domain is disclosed in the document, J. App. Phys. 81, 5471 (1997)(J. App. Phys. 81, 5471 (1997)), for example.

The edge domain is generated because the magnetization is given along the shorter side of rectangle and form a spirally rotating pattern in order to reduce anti-magnetic energy in the shorter side. The magnetization is generated in the direction different from the middle portion in both edge portions of the magnetic material although it is generated in the direction according to magnetic anisotropy in the middle portion of the magnetic material. During spin switching in the rectangular ferromagnetic material, the edge domain is known to grow its size. Thus, the edge domain serves to increase a switching magnetic filed.

The edge domain is sensitive to the shape of the ferromagnetic material. For this reason, the use of an elliptic ferromagnetic material is proposed in U.S. Pat. No. 5,757,695.

Moreover, U.S. Pat. No. 5,748,524 and JPN. PAT. APPLN. KOKAI Publication No. 2000-100153 disclose that the edge domain is fixed to prevent a complicate change of magnetic structure from occurring in spin switching as much as possible. The technique can control magnetization behavior in spin switching but cannot reduce a switching magnetic filed. Moreover, another structure must be added to fix the edge domain; therefore, this is not suitable for achieving high density.

BRIEF SUMMARY OF THE INVENTION

According to a first aspect of the present invention, there is provided a magnetoresistive effect element comprising: a nonmagnetic layer having a first surface and a second surface which face each other; a reference layer provided on the first surface and having a fixed magnetization direction; and a magnetization variable layer provided on the second surface, having variable magnetization direction, and having a planer shape including a rectangular part, a first projected part, and a second projected part, the rectangular part having a first longer side and a second longer side which face each other and a first shorter side and a second shorter side which face each other, the first projected part projecting from the first longer side at a position shifted from the center toward the first shorter side, the second projected part projecting from the second longer side at a position shifted from the center toward the second shorter side.

According to a second aspect of the present invention, there is provided a magnetoresistive effect element comprising: a first nonmagnetic layer having a first surface and a second surface which face each other; a first reference layer provided on the first surface and having a fixed magnetization direction; a second nonmagnetic layer having a third surface and a fourth surface which face each other; a second reference layer provided on the third surface and having a fixed magnetization direction; and a magnetization variable layer interposed between the second and fourth surfaces, having variable magnetization direction, and having a planer shape including a rectangular part, a first projected part, and a second projected part, the rectangular part having a first longer side and a second longer side which face each other and a first shorter side and a second shorter side which face each other, the first projected part projecting from the first longer side at a position shifted from the center toward the first shorter side, the second projected part projecting from the second longer side at a position shifted from the center toward the second shorter side.

DETAILED DESCRIPTION OF THE INVENTION

Figure 1:
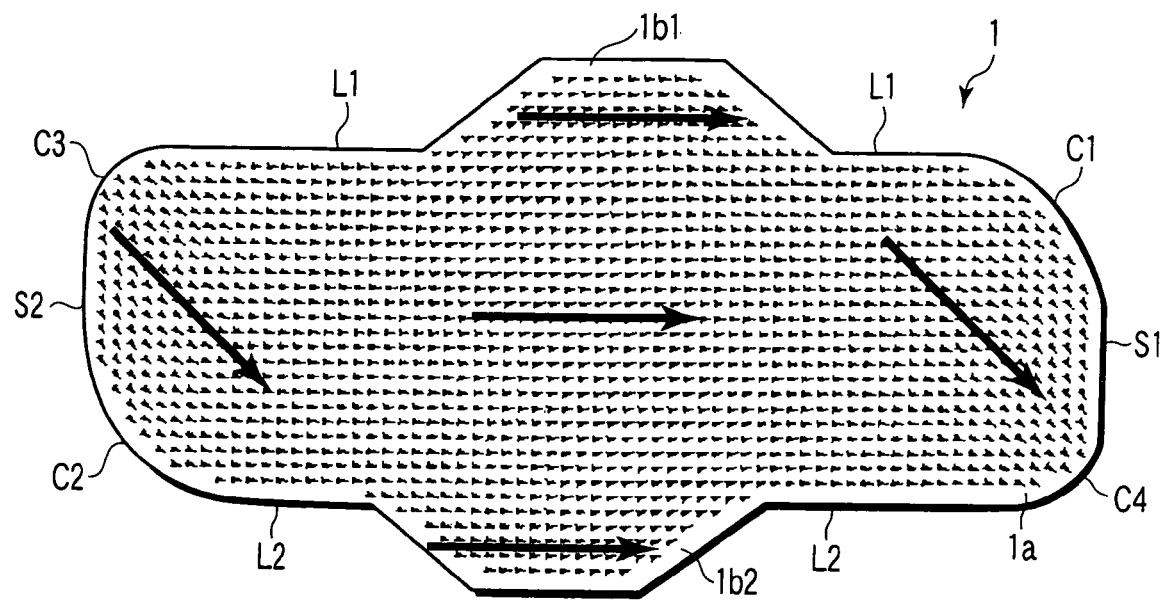
FIG. 1 is a top plan view showing a MTJ element according to one embodiment of the present invention.

One embodiment of the present invention will be described below with reference to the accompanying drawings. In the following description, the same reference numerals are used to designate components having the identical function and configuration, and the overlapping explanation is made if necessary.

Figure 2:
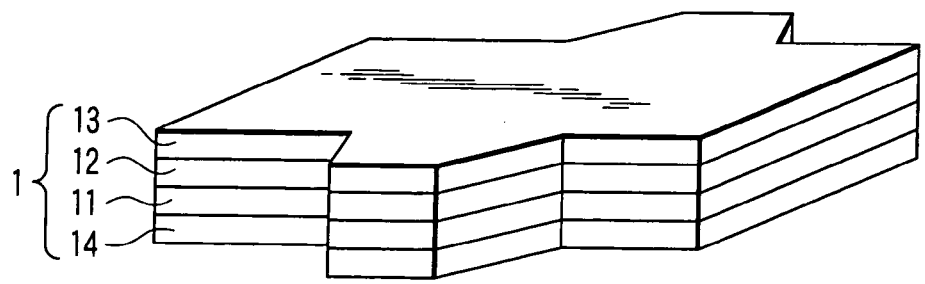
FIG. 2 and FIG. 3 are perspective views showing a MTJ element according to one embodiment of the present invention.
Figure 3:
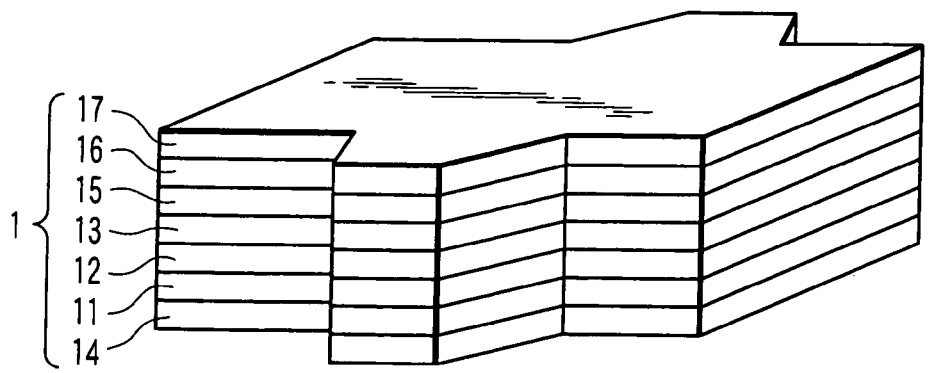

One embodiment of the present invention will be explained using one example of computer simulation results. FIG. 1 is a top plan view showing a MTJ element (magnetoresistive effect element, magnetic recording element) according to one embodiment of the present invention. As shown in FIG. 2, an MTJ element 1 has at least ferromagnetic layer 11, insulating layer 12 and ferromagnetic layer 13, which are successively stacked.

The ferromagnetic layers 11 and/or 13 may have a stacked structure comprising several sub-layers. The magnetization direction of one ferromagnetic layer (e.g., ferromagnetic layer 11) is fixed. This is achieved by providing an anti-ferromagnetic layer 14 below the ferromagnetic layer 11. The ferromagnetic layer 11 is hereinafter referred to as a reference layer.

On the other hand, the fixing mechanism is not given with respect to the magnetization direction of the ferromagnetic layer 13. Thus, the magnetization direction of the ferromagnetic layer 13 is variable. The ferromagnetic layer 13 is hereinafter referred to as a magnetization variable layer (recording layer). Ferromagnetic layers 11, 13 and insulating layer 12 have a planar shape shown in FIG. 1.

As seen from FIG. 2, the MTJ element 1 may have a so-called double tunnel barrier layer structure. In this case, the MTJ element 1 has at least ferromagnetic layer 11, insulating layer 12, ferromagnetic layer 13, insulating layer 15 and ferromagnetic layer 16, which are successively stacked. The ferromagnetic layer 16 has the fixed magnetization direction, and functions as a reference layer. This is achieved by providing an anti-ferromagnetic layer 17 above the ferromagnetic layer 16. The magnetization direction of the ferromagnetic layer 11 is parallel with that of the ferromagnetic layer 16. Of course, the ferromagnetic layer 16 may have a stacked structure comprising several sub-layers.

It is not essential that these layers 11 to 17 forming the MTJ element 1 have all the same shape. In other words, at least the ferromagnetic layer 13 having a variable magnetization has the planar shape shown in FIG. 1.

As illustrated in FIG. 1, the planar shape of the MTJ element 1 is composed of a rectangular part 1a and two projected parts 1b1 and 1b2.

The rectangular part has a rectangular shape as the most typical example; in this case, it may have a substantially rectangular shape. In other words, a square shape is given having the following two longer and shorter sides. Specifically, two longer sides (first and second longer sides L1, L2) mutually face each other. Two shorter sides (first and second shorter sides S1, S2) mutually face each other and shorter than the longer side. Two longer sides and two shorter sides have no need to be parallel with each other so long as they are arranged along the similar direction.

Individual sides of the rectangular part 1a have no need to be fully straight line, and part thereof may comprise a curved line. In other words, a certain side may include a curved portion as long as the side is substantially directed along one direction as a whole. The corner portion of the rectangular part 1a may be any of right angle, acute angle and obtuse angle, and further, may be rounded.

Two projected parts (first and second projected parts 1b1 and 1b2) project along a direction crossing the longitudinal direction of the rectangular part 1a. One projected part (e.g., projected part 1b1) is connected to one longer side (e.g., L1). The other projected part (e.g., projected part 1b2) is connected to the other longer side (e.g., L2). These projected parts 1b1 and 1b2 are substantially trapezoid. The width of each trapezoid becomes gradually wide from the side far from the rectangular part 1a toward there.

Moreover, one projected part (e.g., projected part 1b1) is positioned off the center of the longitudinal direction of the rectangular part 1a toward one shorter side (e.g., shorter side S1). The other projected part (e.g., projected part b2) is positioned off the center of the longitudinal direction of the rectangular part 1a toward the other shorter side (e.g., shorter side S2). Two projected parts 1b1 and 1b2 are positioned between the corner of the rectangular part and the center thereof, and not positioned at the corner.

Some corner of the rectangular shape may be rounded on purpose. The rounded corner is one of two corners formed by one longer side and two shorter sides, that is, a corner on the side where the projected part connected with the longer side shifts from the center point of the rectangular part 1a. In other words, the rounded corner is two corners, that is, a corner C1 formed by the longer side L1 and the shorter side S1 and a corner C2 formed by the longer side L2 and the shorter side S2. When remaining two corners, that is, a corner C3 formed by the longer side L1 and the shorter side S2 and a corner C4 formed by the longer side L2 and the shorter side S1 are actually formed to be intentionally or unintentionally rounded, the curvature of radius of the corners C1 and C2 is larger than that of the corners C3 and C4.

The MTJ element 1 has the planer shape described above; therefore, the planar shape of FIG. 1 is point symmetry with respect to the center point, and non-line symmetry with respect to the longitudinal straight line passing through the center point.

The dimension of each part of the MTJ element 1 having the foregoing shape is as follows. The maximum width is preferably smaller than about 1 μm. The maximum width means the center width of the MTJ element 1, that is, a length of two shorter sides of the rectangular part 1a. The length (in the longitudinal direction) is preferably 1 to 10 times as much as the maximum width. The thickness of individual ferromagnetic layers 11, 13 and 16 forming the MTJ element 1 is less than 20 nm, preferably, 10 nm. In order to achieve high integration of the MTJ element 1, the element (device) size is preferably smaller.

Magnetic materials such as Fe, Co, Ni, these stacked films and alloys may be used as a material for ferromagnetic layers 11, 13 and 16. Ferromagnetic layers 11, 13 and 16 may be a stacked film including a layer consisting of nonmagnetic metal such as Cu, Au, Ru and Al. In the following simulation, $Ni_8Fe$ is used as a ferromagnetic material.

Note that FIG. 1 schematically shows the magnetization direction of each position (each magnetic domain) shown by an arrow under no external magnetic field applied (hereinafter, referred to as zero magnetic filed state). In FIG. 1, each large arrow shows a rough magnetization direction on each position where the arrow is shown and its surroundings. As seen from FIG. 1, the magnetization of each magnetic domain points to the same direction (right direction) in the most part of the rectangular part 1a including the middle portion of the MTJ element 1. In projected parts 1b1 and 1b2, the magnetization of each magnetic domain points to the same direction as the rectangular part 1a. Around the shorter sides S1 and S2 of the rectangular part 1a, the magnetization points to the same direction (from upper left toward lower right) along each edge of the corners C1 and C2 having a large curvature of radius.

Figure 4:
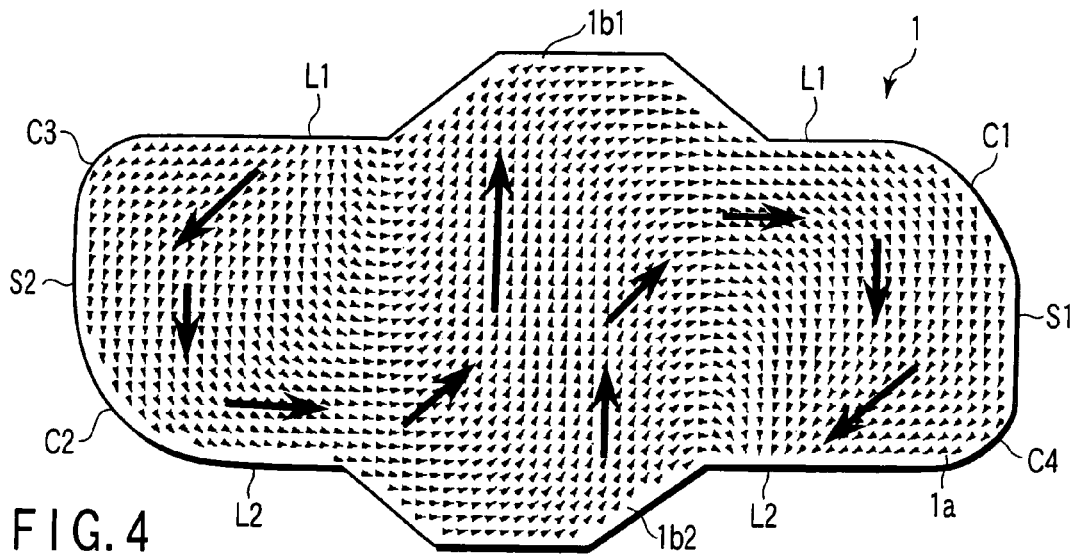
FIG. 4 is a view showing the state of magnetization when a magnetic field is applied to the MTJ element shown in FIG. 1 in one direction only.

The magnetic filed pattern is formed in the zero magnetic field state as described above. For this reason, a change of the magnetic filed pattern is different between when a magnetic filed is applied to the MTJ element 1 in one direction only and when the magnetic field is applied to the MTJ element 1 in two directions. FIG. 4 shows a magnetization state when magnetic field is applied to the MTJ element 1 of FIG. 1 in one direction only. More specifically, FIG. 4 shows a state that magnetization is applied in the direction from the right toward the left in FIG. 4 along the easy magnetization axis (hereinafter, referred simply to as easy axis) of the MJT element 1. In other words, this state corresponds to a semi-select memory cell state in a magnetic memory comprising MTJ elements arrayed like a matrix, as described later. The easy axis (direction of the easy magnetization) is defined as the direction in which the magnetic moment of the ferromagnet is the easiest to point.

As seen from FIG. 4, a ¾ circular magnetic field pattern is formed at individual upper left and lower right positions in the MTJ element 1 around each base of projected parts 1b1 and 1b2. This is a development of a so-called C-type magnetic domain. Two C-type magnetic domains circulating in the direction reverse to each other are formed. In the middle portion of the MTJ element 1, that is, portion between projected parts 1b1 and 1b2, magnetization points from the bottom to the top in FIG. 4. Thus, the magnetization of the MTJ element 1 is hard to be switched. In other words, the magnetic field of the MTJ element 1 is hard to be switched in the semi-select state.

On the other hand, in the selected MTJ element, a magnetic field is applied before it is applied along the easy axis direction. Specifically, a magnetic field is applied in the direction along the hard magnetization axis (hereinafter, referred simply to as hard axis) of the MTJ element 1, that is, the direction from top to bottom in FIG. 4. Thus, magnetization points from the top to the bottom in FIG. 4 in the potion between projected parts 1b1 and 1b2 by the magnetic field applied to the hard axis direction. As a result, the magnetization of the MTJ element 1 is easier to be switched by the magnetic field along the easy axis direction then FIG. 1. Therefore, the magnetization of the selected MTJ element 1 is easily switched. The hard axis (direction of the hard magnetization) is defined as the direction in which the magnetic moment of the ferromagnet is the hardest to point.

Figure 5:
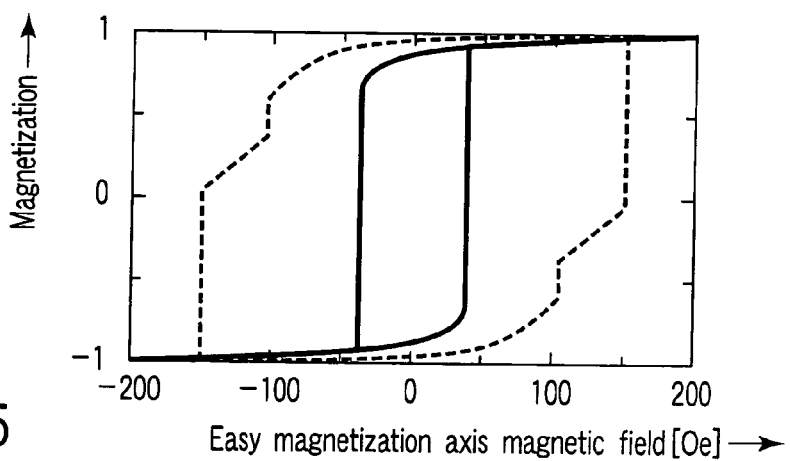
FIG. 5 is a graph showing a magnetization curve obtained by simulation relevant to the MTJ element of FIG. 1.

The following is an explanation about simulation results relevant to the MTJ element having the shape shown in FIG. 1. FIG. 5 is a graph showing a magnetization curve obtained by simulation relevant to the MTJ element having the shape shown in FIG. 1.

The dimension of the MTJ element used for this simulation is as follows. The length is 0.72 μm. The width is 0.24 μm near the shorter side of the rectangular part. The center width of the MTJ element 1, that is, the maximum width is 0.36 μm. The thickness of individual ferromagnetic layers 11, 13 and 16 is 3 nm. This embodiment is not limited to the foregoing dimensions and various different values may be properly set so long as the MTJ element has the shape having the foregoing features.

In FIG. 5, the broken line shows a change of magnetization of the MTJ element 1 (i.e., recording layer 13) when changing a magnetic filed applied in the easy axis (longitudinal direction of the MTJ element 1 of FIG. 1) with no magnetic field applied in the hard axis (i.e., direction perpendicular to the longitudinal direction of FIG. 1) of the MTJ element 1. In other words, the broken line shows the relationship between magnetization of the recording layer 13 of a semi-selected MTJ element and the magnetic field of the easy axis in a magnetic memory having MTJ elements 1 of FIG. 1 arrayed like a matrix.

On the other hand, the solid line in FIG. 5 shows a change of magnetization of the MTJ element 1 (i.e., recording layer 13) when changing a magnetic filed applied in the easy axis direction with a magnetic field of 40 Oe applied in the hard axis of the MTJ element 1. In other words, the solid line shows the relationship between magnetization of the recording layer 13 of a selected MTJ element and the magnetic field of the easy axis in a magnetic memory having MTJ elements 1 of FIG. 1 arrayed like a matrix.

As seen from FIG. 5, a change of magnetization in accordance with a change of the magnetic field is different between the semi-selected MTJ element and selected MTJ element.

As seen from FIG. 5, the coercivity is about 150 Oe in the easy axis of the semi-selected MTJ element. In addition, the magnetization magnitude gradually reduces with an increase of the magnetic field in the semi-selected MTJ element jumps up when reaching a certain value, and thereafter, is switched after further reduces.

On the other hand, in the selected MTJ element, jump-up, which would occur in the semi-selected MTJ element, does not occur. Moreover, the magnetization slightly increases from zero, and then, is switched when reaching about 40 Oe. In other words, magnetization switching is sharply made in the selected MTJ element. Therefore, no intermediate magnetization state other than "1" an "0" is given. This phenomenon implies that micro magnetic domains are not generated in the complicated form in a magnetization switching process.

According to the shape of the MTJ element of this embodiment, spin switching progress differently between the semi-selected state and the selected state. Moreover, the difference of switching magnetic filed is large between the semi-selected state and the selected state. These features mean that the semi-selected MTJ element 1 has a low possibility of being unexpectedly switched; in other words, the MTJ element 1 is hard to be disturbed.

In general, a gap or disturbed portion exists in the magnetization direction of the ferromagnetic material. When a ratio of residual magnetization to saturation magnetization becomes less than 1, tunnel magnetic resistance in the MTJ element using the ferromagnetic material is lower than one using the ferromagnetic material with no gap or disturbed portion. On the contrary, according to this embodiment, ferromagnetic layers 11, 13 and 16 have each the same shape including insulating layers 12 and 15; therefore, this means that these layers 11, 13 and 16 have the same magnetic domain structure. As a result, there is no decrease of the tunnel magnetic resistance in the magnetization direction even when the ratio is less than 1.

Figure 6:
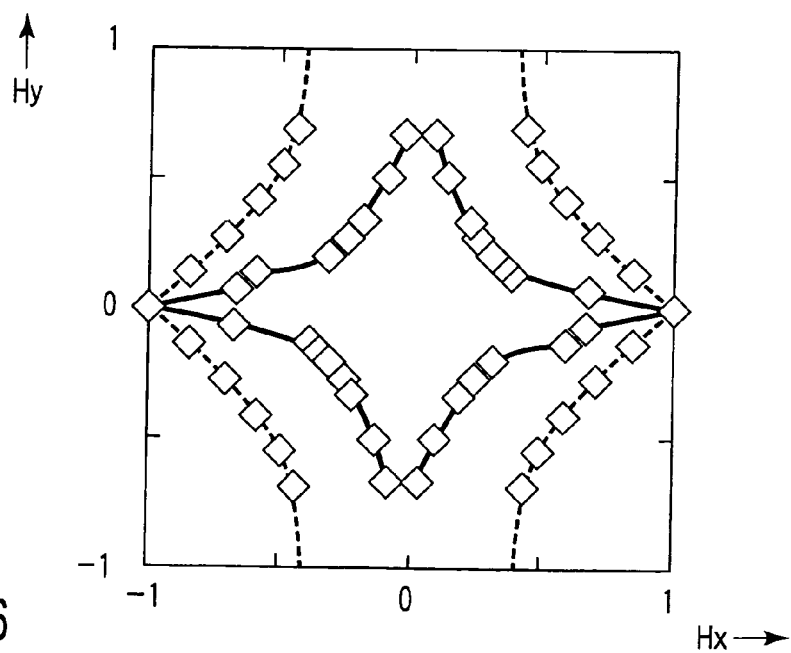
FIG. 6 is a graph showing an asteroid curve obtained by simulation relevant to the MTJ element of FIG. 1.

FIG. 6 shows an asteroid curve (solid line) obtained by simulation relevant to the MTJ element 1 having the shape of FIG. 1 and using the foregoing dimension and material. In FIG. 6, there is shown an asteroid curve (broken line) calculated using a MTJ element having a so-called track shape (L-letter shape), for comparison. FIG. 6 is obtained by plotting values standardized with the coercivity of easy axis.

As seen from FIG. 6, in the MTJ element having the track shape, the asteroid curve does not largely dent toward the origin. Thus, the switching magnetic field (i.e., magnetic field of points positioned outside the asteroid curve) is large, and also, large with respect to the coercivity Hc. For this reason, one magnetic filed (e.g., Hx) which is to be applied in a semi-selected state and large enough to set the MTJ element to a selected state has to be large. The larger the magnetic filed to be applied in a semi-selected state is, the more the magnetization of the recording layer is easy to be switched by only magnetization (e.g., Hx) to set a semi-selected state. In other words, thermal stability is low in the semi-selected state.

On the contrary, in the MTJ element 1 having the shape of this embodiment, the asteroid curve largely dents toward the origin, as compared with the track shape. Thus, the switching magnetic field is small, and also, small with respect to the coercivity Hc. Therefore, one magnetic filed (e.g., Hx) which is to be applied in a semi-selected state and large enough to set the MTJ element to a selected state can be small. As a result, the magnetization of the recording layer is hard to be switched by only magnetization (e.g., Hx) to set a semi-selected state. In other words, thermal stability is high in the semi-selected state.

In the MTJ element 1 of this embodiment, a ratio of the residual magnetization of easy axis direction to saturation magnetization is 0.92. This ratio is almost the same as the MTJ element having a rectangular shape. This is because edge domains exist in the MTJ element 1 of this embodiment.

Figure 7:
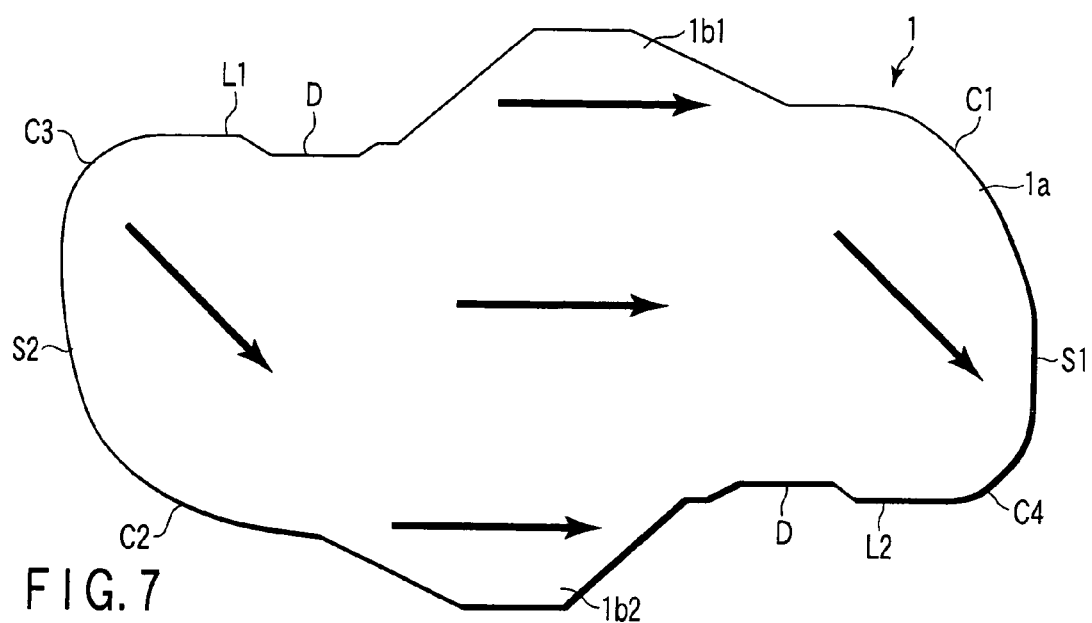
FIG. 7 is a top plan view showing another MTJ element according to one embodiment of the present invention.

The MTJ element 1 of the embodiment may have additionally the following shape features. FIG. 7 is a top plan view showing another MTJ element according to one embodiment of the present invention. As illustrated in FIG. 7, a longer side L1 has a dent D next to the projected part 1b1 at the side opposite to the shifted direction of the projected part 1b1 (i.e., corner C3 side). Likewise, a longer side L2 has a dent D next to the projected part 1b2 at the side opposite to the shifted direction of the projected part 1b2 (i.e., corner C4 side).

In the shape shown in FIG. 1, the MTJ element 1 is point symmetry with respect to the center point, and non-line symmetry with respect to the longitudinal direction passing the center point.

In FIG. 7, there is schematically shown a magnetization direction on at each position in a zero magnetic field using an arrow, like FIG. 1. As shown in FIG. 1, the MTJ element 1 has the foregoing shape; therefore, each magnetic domain points to the following direction. Specifically, the magnetization of each magnetic domain points to the same direction in the most part of the rectangular part 1a including the middle portion of the MTJ element 1, like the case of FIG. 1. In projected parts 1b1 and 1b2, the magnetization of each magnetic domain points to the same direction (right direction) as the rectangular part. In shorter sides S1 and S2 of the rectangular part 1a, each magnetization points to the same direction (from upper left toward lower right) along corners C1 and C2 having a large curvature of radius.

Figure 8:
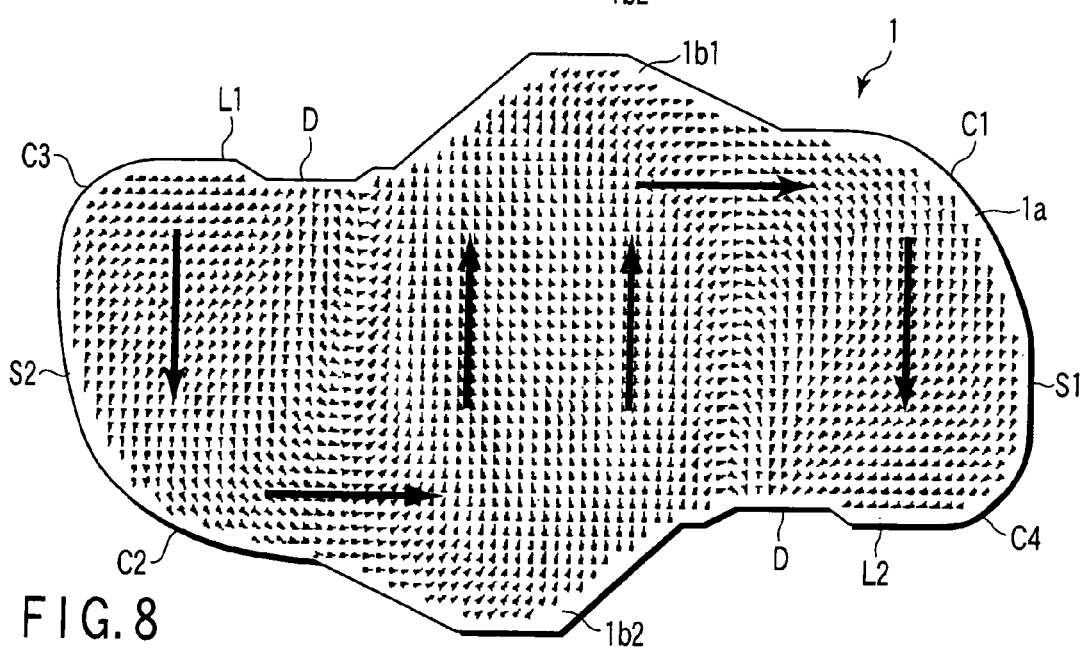
FIG. 8 is a view showing the state of magnetization when a magnetic field is applied to another MTJ element shown in FIG. 7 in one direction only.

FIG. 8 shows a state of magnetization when a magnetic filed is applied to the MTJ element of FIG. 7 in one direction only, like the case of FIG. 4. As depicted in FIG. 8, right and left sides of the MTJ element 1 in the longitudinal direction is formed with two C-type magnetic domains, like the case of FIG. 4. In these two C-type magnetic domains, their magnetizations point to the direction opposite to each other around the dent D. Therefore, a magnetic filed of the MTJ element 1 is hard to be switched in a semi-selected state.

The selected MTJ element 1 takes the same magnetization pattern as the case of FIG. 1.

Figure 9:
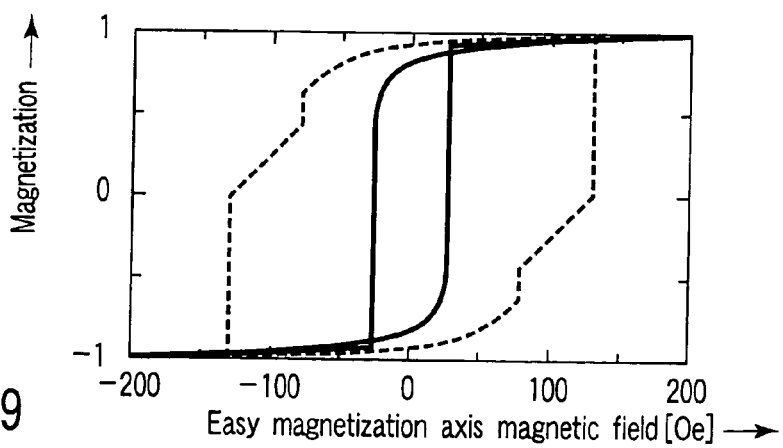
FIG. 9 is a graph showing a magnetization curve obtained by simulation relevant to another MTJ element of FIG. 7.

FIG. 9 is a graph showing a magnetization curve obtained by simulation relevant to the MTJ element having the shape shown in FIG. 7. The dimension of the MTJ element used for this simulation is as follows. The length is 0.76 µm. The width of the edge portion is 0.28 µm. The center width of the MTJ element 1, that is, the maximum width is 0.38 µm. The thickness of individual ferromagnetic layers 11, 13 and 16 is 3 nm.

In FIG. 9, the broken line shows a change of magnetization of the MTJ element 1 (i.e., recording layer 13) when changing a magnetic filed applied in the easy axis of the MTJ element 1 with no magnetic field applied in the hard axis of the MTJ element 1, like the case of FIG. 5. In other words, the broken line shows the relationship between magnetization of the recording layer 13 of the semi-selected MTJ element 1 and the magnetic field of the easy axis.

On the other hand, the solid line in FIG. 5 shows a change of magnetization of the MTJ element 1 (i.e., recording layer 13) when changing a magnetic filed applied in the easy axis with a magnetic field of 40 Oe applied in the hard axis of the MTJ element 1 like the case of FIG. 5. In other words, the solid line shows the relationship between magnetization of the recording layer 13 of the selected MTJ element 1 and the magnetic field of the easy axis.

As seen from FIG. 9, magnetization switching is sharply made in the selected state MTJ element 1, like the case of FIG. 5. On the other hand, the magnetization is hard to be switched in the semi-selected MTJ element 1. Moreover, the difference of switching magnetic field is large between the semi-selected state and the selected state. This means that the MTJ element 1 has high thermal stability, and is hard to be disturbed, like the case of FIG. 5.

In FIG. 9, switching magnetic field is smaller than the case of FIG. 5. Therefore, a write current required for switching the magnetization of the MTJ element having the shape of FIG. 7 is smaller than that of FIG. 1. As seen from FIG. 9, the residual magnetization state is high, that is, 0.927.

The following is an explanation about the method of manufacturing the MTJ element according to the embodiment. In general, the MTJ element is formed via the following processes. First a stacked film comprising several films forming the MTJ element is formed. Then, a mask material consisting of resist is coated on the stacked layer, and thereafter, a pattern is transferred into the mask material using light, electron beam or X rays. The mask material is developed, and thereby, a pattern is formed in the mask material. Ion milling or etching is carried out using the mask material as a mask, and thereby, the stacked film is patterned into a shape corresponding to the pattern of the mask material. Thereafter, the mask material is removed.

If a relatively large size, for example, micron-order MTJ element is manufactured, the following process may be carried out. First, a stacked film is formed using sputtering, and thereafter, a hard mask such as silicon oxide and silicon nitride is formed on the stacked film. Then, the hard mask is patterned using reactive ion etching (RIE). Thereafter, the stacked film is subjected to ion milling using the hard mask, and thereby, a MTJ element is formed.

Moreover, if a smaller, for example, sub-micron size MTJ element having a range from 0.1 to 2 or 3 0.1 µm is manufactured, photo-lithography may be used. In this case, a hard mask having a shape pattern of MTJ element is prepared, and the stacked film is patterned using the hard mask.

If a smaller size, for example, MTJ element having 0.5 µm or less is manufactured, electron beam exposure is used. However, in this case, the element itself is very small; for this reason, a shape portion for widening edge domain becomes smaller in the MTJ element of this embodiment. As a result, it is very difficult to manufacture the foregoing MTJ element. In order to manufacture the MTJ element 1 of this embodiment, proximity effect correction by electron beam may be used.

Usually, the proximity effect correction involves correcting proximity effect in a graphic pattern, which is caused by back scattering of electron beam from a substrate, to form a pattern loyal to a desired pattern. For example, if a rectangular pattern is formed, accumulated electron charge near the corner is not high enough; for this reason, the corner of the rectangle may be rounded. In order to clear the corner, correction point beam may be applied outside the pattern in the vicinity of the vertex if a 0.5 µm or less device (element) to be manufactured, in particular. By doing so, the electron charge is increased, and thereby, a pattern loyal to the desired pattern is obtained.

The proximity effect correction can be used to form a shape of the MTJ element having an edge portion whose width is widened. For example, if shapes shown in FIG. 1 and FIG. 7 are to be formed, a rectangle is used as a basic pattern, and correction point beam is applied to two corners facing each other. By doing so, a shape with a widened width at an edge is formed. In this case, the shape of the rectangle is controlled in addition to correction on the shape of the corner in the following manner. Specifically, it is controlled by increasing the applied charge, or properly controlling an applied position of the correction point beam, or using both of the former and the latter. By doing so, the shape of the MTJ element 1 according to this embodiment is realized. The foregoing correction point beam is applied to several points, and thereby, it is possible to form a projected part, and to give a roundness of the corner of a rectangular part.

The MTJ element 1 according to this embodiment is applicable to a magnetic random access memory (MRAM). In general, a random access memory has a need to have a small size and large capacity. Thus, it is preferable that line width and area of each memory cell are small. The MTJ element 1 serves to realize a high-speed switching memory cell having small switching magnetic field, small write current required for writing data and low power consumption. Therefore, the MTJ element 1 is preferably applicable to the memory cells of the MRAM.

The case where the MTJ element of this embodiment is used as a memory cell of MRAM will be explained below with reference to FIG. 10 to FIG. 12.

Figure 10:
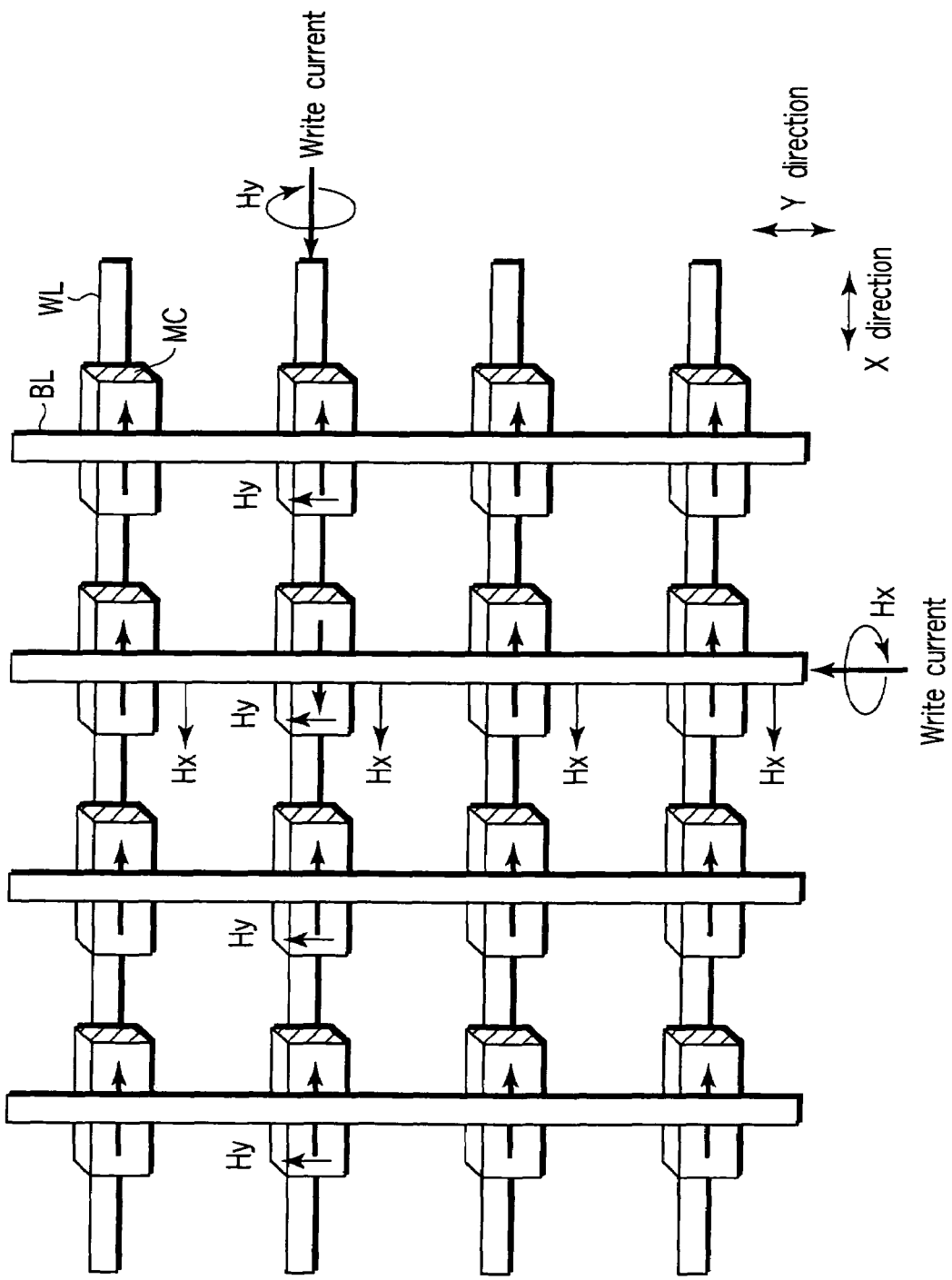
FIG. 10 is a view showing one example of a planar layout of a cell array of a MRAM.

FIG. 10 schematically shows a planer layout of a cell array of a MRAM. As shown in FIG. 10, several bit lines BL for writing and reading and word lines WL (write word line WWL) extend to the direction different from each other. Typically, the word line WL extends along the x direction and the bit line extends along the y direction perpendicular to the x direction. The intersection of the bit line BL and the word line WL is provided with a memory cell MC including the MTJ element 1.

The longitudinal direction of the MTJ element 1 extends along the word line WL. Each bit lines BL is electrically connected with one terminal of several MTJ elements 1 in the same row (or column). Each word line WL is arranged to closely face the other end of several MTJ elements 1 in the same row (or column). For example, the memory cell MC has a so-called cross point structure or so-called 1Tr+1MTJ structure, as described later.

A write current flowing through the word line WL toward the left along the x direction applies a magnetic field Hy to the upper direction along the y direction to memory cells through which the foregoing word line WL passes. The write current flowing through the bit line BL toward the upper direction along the y direction applies a magnetic field Hx to the left direction along the x direction to memory cells through which the foregoing bit line BL passes.

As described above, application of two magnetic fields to the MTJ element 1 of the memory cell MC which is provided at the intersection point of the bit line BL and the word line WL switches the magnetization direction of the recording layer 13 of the MTJ element 1. Thus, information is written to a target memory cell MC.

Information is read in by applying a voltage to recording layer 13 and reference layer 11 of the selected memory cell MC, and reading a resistance value from a current flowing through it. Information may be read by flowing a constant current through the MTJ element 1 of the selected memory cell to read a voltage between recording layer 13 and reference layer 11.

Figure 11:
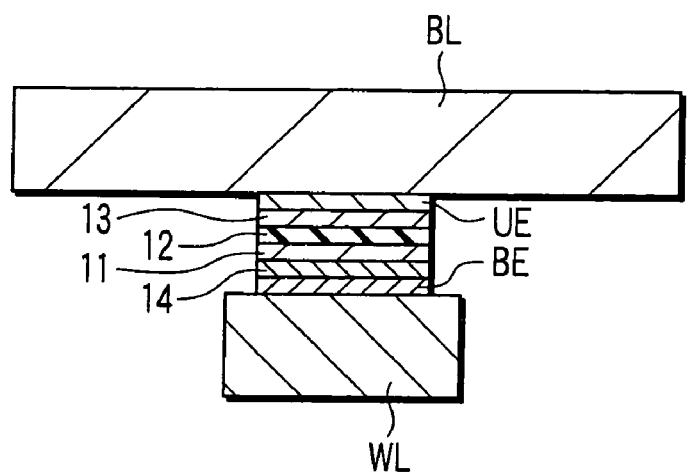
FIG. 11 is a view showing a memory cell having a cross point structure.

FIG. 11 shows an application of the MTJ element 1 of the embodiment to a memory cell having a so-called cross point structure. As depicted in FIG. 11, the memory cell MC comprises the MTJ element 1 only. One end of the MTJ element 1 is electrically connected to a bit line BL via an electrode UE. The other end of the MTJ element 1 is electrically connected to a word line WL via an electrode BE.

The bit line BL and word line WL are connected to a driver circuit and sink circuit for carrying a current to a direction corresponding to written data. These sink circuit and driver circuit are connected to a decoder circuit. The decoder circuit controls sink and driver circuits so that a magnetic field is applied to the MTJ element in accordance with an address signal supplied externally and a current is carried through bit line BL and word line WL. The bit line BL is further connected with a read circuit such as sense amplifier.

Figure 12:
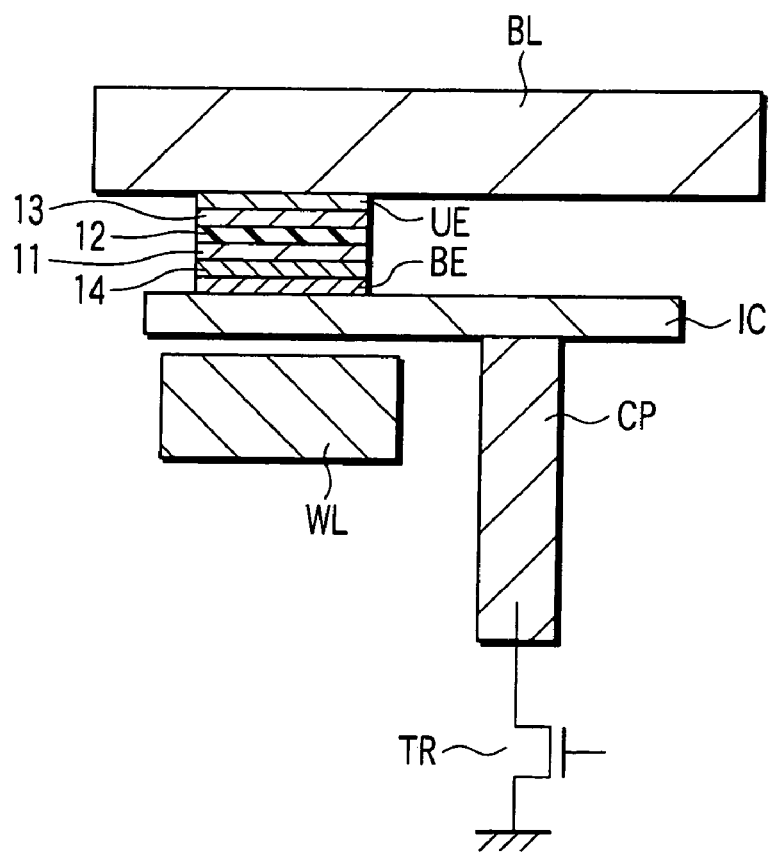
FIG. 12 is a view showing a memory cell having a 1Tr+1MTJ structure.

FIG. 12 shows an application of the MTJ element 1 of the embodiment to a memory cell having a so-called 1Tr+1MTJ structure. As seen from FIG. 12, a memory cell MC is composed of MTJ element 1 (shown in FIG. 2) and MOS (Metal Oxide Semiconductor) transistor TR used as a read switching element.

One end of the MTJ element 1 is electrically connected to a bit line BL via an upper electrode UE. The other end of the MTJ element 1 is electrically connected to one end of the switching element TR via bottom electrode BE, conductive layer and contact plug CP. The other end of the switching element is grounded.

A diode may be used as the switching element TR in place of the MOS transistor.

The word line (write word line) WL is used to carry a current in an write operation, and positioned below the conductive layer IC and apart from it. The word line WL is connected to driver circuit and sink circuit. These sink circuit and driver circuit are connected to a decoder. The bit line BL is connected to driver circuit, sink circuit and read circuit such as sense amplifier. The switching element TR is supplied with a signal for selecting a predetermined memory cell MC in a read operation via a read word line (not shown).

According to one embodiment of the present invention, the MTJ element 1 is composed of substantially rectangular part and two projected parts, which face each other and positioned off the center of the rectangular part along the longitudinal direction thereof. The foregoing shape can preferably controls the magnetic structure, in particular, edge domain of the ferromagnetic layer (i.e., ferromagnetic layers 11, 13, 16) of the MTJ element 1. When the MTJ element 1 is used as a memory cell of an MRAM, the magnetic structure of the ferromagnetic layer is different between a semi-selected state and a selected state. Thus, large write margin is secured as compared with the conventional case, and the MTJ element 1 having thermal stability is realized.

Moreover, the thermal stability is high; therefore, even if the MTJ element 1 is made into a small size, a write error is hard to occur resulting from thermal fluctuation. Reducing MTJ element 1 can improve the integration level of a memory cell when the MTJ element 1 is applied as a memory cell of a MRAM. Small sized MTJ element 1 with small switching magnetic field can reduce power consumption in the MRAM.

This embodiment does not employ the configuration of controlling edge domains by applying a bias magnetic filed to the MTJ element 1. Therefore, no additional structure for applying the bias magnetic filed is required.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive effect element comprising:
a nonmagnetic layer having a first surface and a second surface which face each other;
a reference layer provided on the first surface and having a fixed magnetization direction;
a magnetization variable layer provided on the second surface, having variable magnetization direction, and having a planer shape including a rectangular part, a first projected part, and a second projected part, the rectangular part having a first longer side and a second longer side which face each other and a first shorter side and a second shorter side which face each other, the first projected part projecting from the first longer side at a position shifted from the center toward the first shorter side, the second projected part projecting from the second longer side at a position shifted from the center toward the second shorter side;
a first corner made by the first longer side and the first shorter side;
a second corner made by the second longer side and the second shorter side;
a third corner made by the first longer side and the second shorter side, the third corner being smaller than the first and second corners; and
a fourth corner made by the second longer side and the first shorter side, the fourth corner being smaller than the first and second corners.

2. The element according to claim 1, wherein the planer shape is a point symmetry with respect to the center, and is non-line symmetry with respect to a longitudinally straight line passing through the center.

3. The element according to claim 1, wherein the first to fourth corners comprise a curved line.

4. The element according to claim 1, wherein the first longer side has a dent formed between the first projected part and the third corner, and the second longer side has a dent formed between the second projected part and the fourth corner.

5. A magnetoresistive effect element comprising:
a first nonmagnetic layer having a first surface and a second surface which face each other;
a first reference layer provided on the first surface and having a fixed magnetization direction;
a second nonmagnetic layer having a third surface and a fourth surface which face each other;
a second reference layer provided on the third surface and having a fixed magnetization direction;
a magnetization variable layer interposed between the second and fourth surfaces, having variable magnetization direction, and having a planer shape including a rectangular part, a first projected part, and a second projected part, the rectangular part having a first longer side and a second longer side which face each other and a first shorter side and a second shorter side which face each other, the first projected part projecting from the first longer side at a position shifted from the center toward the first shorter side, the second projected part projecting from the second longer side at a position shifted from the center toward the second shorter side;
a first corner made by the first longer side and the first shorter side;
a second corner made by the second longer side and the second shorter side;
a third corner made by the first longer side and the second shorter side, the third corner being smaller than the first and second corners; and
a fourth corner made by the second longer side and the first shorter side, the fourth corner being smaller than the first and second corners.

6. The element according to claim 5, wherein the planer shape is a point symmetry with respect to the center, and is non-line symmetry with respect to a longitudinally straight line passing through the center.

7. The element according to claim 5, wherein the first to fourth corners comprise a curved line.

8. The element according to claim 5, wherein the first longer side has a dent formed between the first projected part and the third corner, and the second longer side has a dent formed between the second projected part and the fourth corner.

9. A magnetoresistive effect element comprising:
a nonmagnetic layer having a first surface and a second surface which face each other;
a reference layer provided on the first surface and having a fixed magnetization direction; and
a magnetization variable layer provided on the second surface, having variable magnetization direction, and having a planer shape including a rectangular part, a first projected part, and a second projected part, the rectangular part having a first longer side and a second longer side which face each other and a first shorter side and a second shorter side which face each other, the first projected part projecting from the first longer side at a position shifted from the center toward the first shorter side, the second projected part projecting from the second longer side at a position shifted from the center toward the second shorter side, wherein a first corner made by the first longer side and the first shorter side, a second corner made by the second longer side and the second shorter side, a third corner made by the first longer side and the second shorter side, and a fourth corner made by the second longer side and the first shorter side comprise curved lines, a curvature of radius of the first corner is larger than that of the third and fourth corners, and a curvature of radius of the second corner is larger than that of the third and fourth corners.

10. The element according to claim 9, wherein the planer shape is a point symmetry with respect to the center, and is non-line symmetry with respect to a longitudinally straight line passing through the center.

11. A magnetoresistive effect element comprising:

a first nonmagnetic layer having a first surface and a second surface which face each other;

a first reference layer provided on the first surface and having a fixed magnetization direction;

a second nonmagnetic layer having a third surface and a fourth surface which face each other;

a second reference layer provided on the third surface and having a fixed magnetization direction; and a magnetization variable layer interposed between the second and fourth surfaces, having variable magnetization direction, and having a planer shape including a rectangular part, a first projected part, and a second projected part, the rectangular part having a first longer side and a second longer side which face each other and a first shorter side and a second shorter side which face each other, the first projected part projecting from the first longer side at a position shifted from the center toward the first shorter side, the second projected part projecting from the second longer side at a position shifted from the center toward the second shorter side, wherein a first corner made by the first longer side and the first shorter side, a second corner made by the second longer side and the second shorter side, a third corner made by the first longer side and the second shorter side, and a fourth corner made by the second longer side and the first shorter side comprise curved lines, a curvature of radius of the first corner is larger than that of the third and fourth corners, and a curvature of radius of the second corner is larger than that of the third and fourth corners.

12. The element according to claim 11, wherein the planer shape is a point symmetry with respect to the center, and is non-line symmetry with respect to a longitudinally straight line passing through the center.

* * * * *